United States Patent
Ou Yang et al.

(10) Patent No.: US 10,620,247 B2
(45) Date of Patent: Apr. 14, 2020

(54) SYSTEM AND METHOD TO DETECT CAPACITANCE OF A POWER SUPPLY UNIT

(71) Applicant: QUANTA COMPUTER INC., Taoyuan (TW)

(72) Inventors: Kuang-Hua Ou Yang, Taoyuan (TW); Chih-Chang Tsai, Taoyuan (TW); Shu-Chen Ning, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 95 days.

(21) Appl. No.: 15/717,533

(22) Filed: Sep. 27, 2017

(65) Prior Publication Data
US 2019/0094279 A1     Mar. 28, 2019

(51) Int. Cl.
| G01R 27/26 | (2006.01) |
| H02M 1/42 | (2007.01) |
| G01R 31/40 | (2020.01) |
| G06F 1/28 | (2006.01) |
| H02M 3/157 | (2006.01) |

(52) U.S. Cl.
CPC ......... *G01R 27/2605* (2013.01); *G01R 31/40* (2013.01); *G06F 1/28* (2013.01); *H02M 1/42* (2013.01); *H02M 3/157* (2013.01)

(58) Field of Classification Search
CPC ... G01R 27/2605; G01R 31/40; H02M 3/157; H02M 1/42; G06F 1/28
See application file for complete search history.

(56) References Cited

U.S. PATENT DOCUMENTS

| 2006/0052970 A1* | 3/2006 | Arabi ...................... G06F 1/206 |
| | | 702/132 |
| 2011/0210879 A1* | 9/2011 | Barrow ............... H01L 27/0207 |
| | | 341/136 |
| 2015/0069957 A1 | 3/2015 | Chang et al. |
| 2015/0123719 A1* | 5/2015 | Kayama ............. H03K 19/0008 |
| | | 327/143 |

(Continued)

FOREIGN PATENT DOCUMENTS

| CN | 104749525 A | 7/2015 |
| EP | 3018813 A1 | 5/2016 |

(Continued)

OTHER PUBLICATIONS

TW Office Action for Application No. 107105966, dated Nov. 1, 2018, w/ First Office Action Summary.

(Continued)

*Primary Examiner* — Huy Q Phan
*Assistant Examiner* — Zannatul Ferdous
(74) *Attorney, Agent, or Firm* — Nixon Peabody LLP; Zhou Lu (57) ABSTRACT

A power supply unit that allows measurement of the capacitance without interrupting operation of the unit is disclosed. The unit includes a controller that causes a voltage change of a capacitor from a first threshold voltage between two periods of time. The time difference of when the voltage reaches a second threshold voltage is measured and the capacitance is determined from the time measurement, voltage change and power dissipation. The determination of capacitance may be performed while the power supply unit is actively supplying power.

14 Claims, 3 Drawing Sheets

(56) References Cited

U.S. PATENT DOCUMENTS

2017/0222557 A1    8/2017  Crawley
2018/0069274 A1*  3/2018  Matsubara ............... H02H 7/18

FOREIGN PATENT DOCUMENTS

| TW | 201005615 A | 2/2010 |
| TW | 201417451 A | 5/2014 |
| TW | 201520572 A | 6/2015 |
| TW | 201526462 A | 7/2015 |
| WO | 2010149234 A1 | 12/2010 |
| WO | 2013107497 A1 | 7/2013 |

OTHER PUBLICATIONS

TW Search Report for Application No. 107105966, dated Nov. 1, 2018, w/ First Office Action.
Extended European Search Report for EP Application No. 18174800.5, dated Jul. 20, 2018.

* cited by examiner

SYSTEM AND METHOD TO DETECT CAPACITANCE OF A POWER SUPPLY UNIT

TECHNICAL FIELD

The present disclosure relates generally to power supplies. More particularly, aspects of this disclosure relate to detecting the capacitance of a power supply unit by charging or discharging of a capacitor in normal operation of the power supply unit.

BACKGROUND

Computer systems and devices generally receive electrical power through a power supply unit (PSU). A power supply unit includes electronic components such as a power factor circuit and a DC to DC converter to insure proper power supply to all components in a computer system. A power supply unit generally receives power from an external source such as an alternating current source and converts the power to voltage outputs appropriate for powering the various components in a computer system. A power supply unit will often include electronic components to allow distribution of power to the various devices of the computer system. A power supply unit thus will include a capacitor to assist in smoothing out voltage signals to produce an uninterrupted and uniform power supply signal. The capacitor also assists in changing voltage levels output from the power supply unit.

In order for the power supply unit to function correctly, the capacitor should not be charged beyond a capacitance limit. Otherwise, overcharging of the capacitor can affect the performance of the capacitor and thereby prevent the proper operation of the power supply unit. Therefore, measuring the capacitance of the capacitor is necessary to prevent the capacitor from being overcharged and also to determine whether the power supply unit is operating within normal parameters.

Currently, a power supply unit must be shut down in order to measure the capacitance of the capacitor. Such shut downs are inconvenient as the entire system must be powered down to perform the measurement. Measurement of capacitance while the power supply unit is operational is thus currently difficult to achieve because it requires disabling the power supply thereby interrupting device operation.

Thus, there is a need for a power supply unit that allows measurement of capacitance during normal operation of the power supply unit. There is also a need for a power supply unit that can measure the capacitance value and store the data for detection of faults. There is a further need for a power supply unit that measures internal capacitance through either charge or discharge of an internal capacitor.

SUMMARY

One disclosed example is a system to detect a capacitance of a capacitor in a power supply unit. The system includes a capacitor storing charge from a voltage source. A power correction circuit sets the voltage output from the capacitor at a first threshold voltage and changes the voltage output from the capacitor to a second threshold voltage via the voltage source. A controller is operable to determine a first time when the voltage output from the capacitor is at the first threshold voltage. The controller is operable to determine a second time when the voltage output from the capacitor is at the second threshold voltage and to determine power dissipation from the power supply unit between the first and second times. The controller determines the capacitance based on the first and second threshold voltages, the first and second times and the power dissipation.

Another example is a method of determining the capacitance of a power supply unit during operation of the power supply unit. An output voltage of a capacitor is set to a first threshold voltage at a first time. The output voltage of the capacitor is changed to a second threshold voltage. A determination is made when the capacitor outputs the second threshold voltage. A second time is determined when the capacitor outputs the second threshold voltage. The power dissipated by the power supply unit between the first and second times is determined. The capacitance of the capacitor is determined based on the first and second threshold voltages, the first and second times and the power dissipation.

Another example is a power supply unit operable to determine capacitance during operation. The power supply unit includes a power input, a power correction factor circuit coupled to the power input to output a voltage and a capacitor coupled to the power correction factor circuit. The power correction circuit sets the voltage output from the capacitor at a first threshold voltage and changes the voltage output from the capacitor to a second threshold voltage. A DC to DC converter is coupled to the capacitor. The DC to DC converter includes a power output. A controller is operable to determine a first time when the voltage output from the capacitor is at the first threshold voltage and determine a second time when the voltage output from the capacitor is at the second threshold voltage. The controller determines power dissipation from the power supply unit between the first and second times. The controller determines the capacitance based on the first and second threshold voltages, the first and second times and the power dissipation.

The above summary is not intended to represent each embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. There are shown in the drawings, and will herein be described in detail, representative embodiments with the understanding that the present disclosure is to be considered as an exemplification or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

Figure 1:
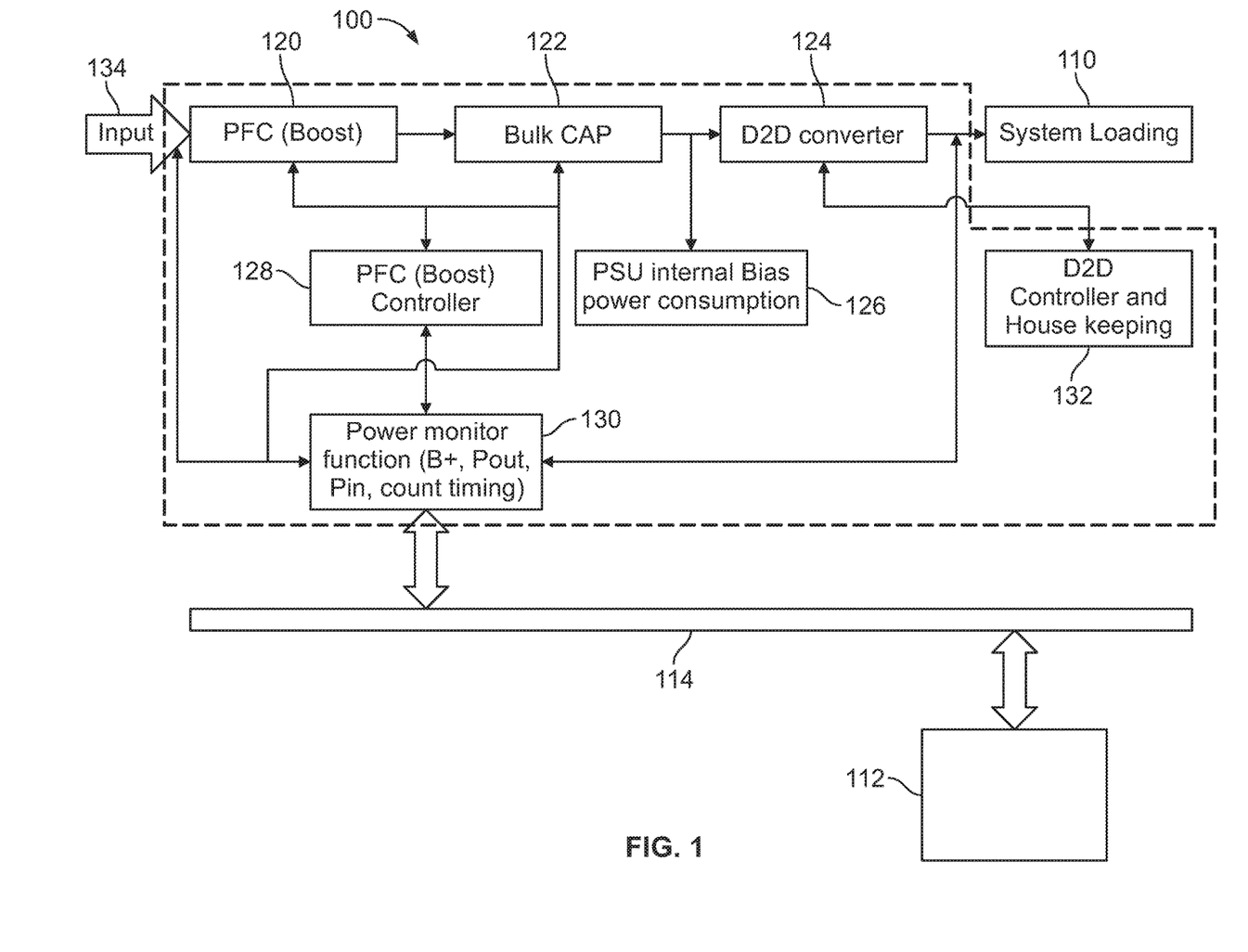
FIG. 1 shows a block diagram of a power supply unit that allows monitoring of capacitance.

FIG. 1 shows a power supply unit (PSU) 100 that is coupled to a load represented by a system 110 that may be a device or a computer or other components that draw power from the power supply unit 100. In FIG. 1, a monitoring system 112 is provided, coupled to a power management bus (PMBus) 114 that communicates with the PSU 100 to obtain device attributes such as measured voltage and current levels, temperatures, and fan speeds.

In this example, the PMBus command space may be used by the monitoring system 112 to determine a variety of readable, and writable, device attributes such as measured voltage and current levels, temperatures, and fan speeds. Different devices on the load system 110 will output different attributes through the bus 114. Devices such as the PSU 100 may have set warning and fault limits, where crossing a limit such as capacitance will alert the monitoring system 112 and possibly trigger fault recovery data via the PMBus 114.

The PSU 100 includes a power factor correction circuit 120, a bulk capacitor 122, a DC to DC converter 124 and an internal bias circuit 126. The PSU 100 also includes a power factor boost controller 128, a power monitor controller 130 and a D2D controller 132. A power input 134 provides input power to the PSU 100. The input power from the power input 134 is coupled to the power factor correction circuit 120. The power factor correction circuit 120 reduces the amount of reactive power produced by the computer system powered by the PSU 100 and outputs an input voltage to the capacitor 122. The capacitor 122 serves to smooth the output voltage and may charge or discharge depending on changes in voltage controlled by the power factor correction circuit 120. The DC to DC converter 124 is coupled to the capacitor 122 and converts the voltage output from the capacitor 122 based on control signals from the D2D controller 132. The output from the DC to DC converter 124 is coupled to components such as the load system 110 that are powered by the power supply unit 100. The power monitor controller 130 is coupled to the power input 134, the output from the DC to DC converter 124, the capacitor 122, the power factor correction circuit 120 and the controller 128 and monitors the power from the power input 134, the output power from the DC to DC converter 124, the voltage of the bulk capacitor 122 (B+) and clock signals.

In this example, the power monitor controller 130 may be part of a baseboard management controller for a computer system that is powered by the power supply unit 100. The power monitor controller 130 thus is part of a service processor that monitors the physical state of the load system 110 that may include the power supply unit 100. The power monitor controller 130 may also be other types of processors or controllers such as a microprocessor control unit (MCU), a baseboard management controller (BMC), a digital signal processor (DSP), a separate controller, or a specialized integrated circuit. The power monitor controller 130 may generally include a memory for storing data values. In this example, the power monitor controller 130 operates to determine the capacitance of the capacitor 122 while the PSU 100 is operating to supply power to the load system 110. The power monitor controller 130 may initiate the measurement of the capacitance in response to an external command via the bus 114, or in response to an internal monitoring signal indicating potential malfunction of the power supply system 100, or according to a periodic predetermined time to check the capacitance. The external command may be issued in response to the detection of an abnormality of power to the load 110 from the external monitoring system 112 or in response to another triggering command.

In this example, the PSU 100 can measure the capacitance during normal operation. The capacitor 122 stores charge from a voltage source such as the voltage input 134. The power factor boost controller 128 sets the voltage output of the capacitor 122 at a first threshold voltage and changes the voltage output of the capacitor 122 to a second threshold voltage via the voltage source. The power monitor controller 130 is operable determine a first time when the voltage output from the capacitor 122 is at the first threshold voltage. The power monitor controller 130 determines a second time when the voltage output from the capacitor 122 is at the second threshold voltage. The power monitor controller 130 determines power dissipation from the power supply unit 100 between the first and second times. The power monitor controller 130 determines the capacitance based on the first and second threshold voltages, the first and second times and the power dissipation.

In one example of determining the capacitance, the capacitor 122 is discharged. The controller 128 controls the power factor correction circuit 120 to increase the voltage input to the capacitor 122 to a specific first threshold voltage. The voltage level of the first threshold voltage is set so it does not exceed the operational limit of the capacitor 122. For example, the operational limit of the capacitor may be 450 V in one example, and therefore the controller 128 increases the voltage output via the power factor correction circuit 120 to 430 V. The time that the voltage from the capacitor 122 reaches the voltage output of 430 V is determined based on the count timing data received from the power monitor 130 and stored in memory.

After the capacitor 122 reaches the first threshold voltage, the controller 128 turns off the power signal output, thereby allowing the capacitor 122 to discharge. The discharge of the capacitor 122 occurs in normal operation to maintain the voltage output of the PSU 100 through the DC to DC converter 124. The controller 128 monitors the voltage output via the power monitor 130 sensing the power output from the DC to DC converter 124 while the capacitor 122 is discharging. When the voltage output reaches a predetermined second threshold voltage, the power monitor controller 130 determines the time the voltage output from the capacitor 122 reaches the second threshold voltage from the count timing data. For example, the second threshold voltage could be 330 V. The second time when the output voltage of the capacitor 122 reaches the second threshold voltage is also stored by the power monitor controller 130.

The power monitor controller 130 may then turn on the power factor correction circuit 120 to charge the capacitor 122 to a level sufficient to maintain a desired power flow from the PSU 100. The power monitor controller 130 may determine the capacitance of the capacitor 122 by determining the time elapsed between the first and second times, determining the power dissipated during the time period and determining the deviation between the corresponding first and second threshold voltages. The power monitor controller 130 may transmit the determined capacitance via the bus 114 to the monitoring system 112.

Figure 2A:
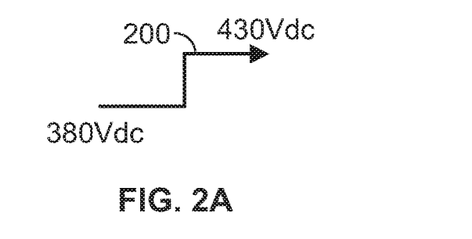
FIGS. 2A and 2B are graphs showing the voltage output from the power supply unit in FIG. 1 and the voltage output at the capacitor in the power supply unit in FIG. 1 during measurement of capacitance by discharging the capacitor.

FIG. 2A is a graph showing a curve 200 representing the output voltage from the power factor correction circuit 120 during the measurement process initiated by discharging the capacitor 122. As may be seen in FIG. 2A, the input voltage to the capacitor 122 begins at 380 V, which is the normal output in this example. The power monitor controller 130 increases the output voltage of the power factor correction circuit 120 to the first threshold voltage of 430 V as shown in FIG. 2A.

Figure 2B:
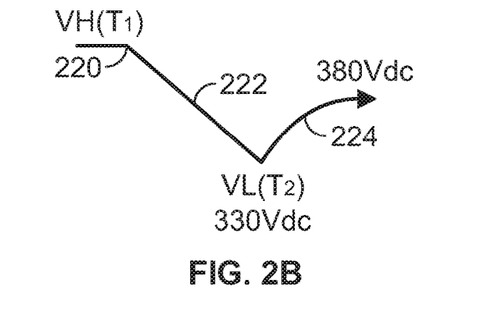

FIG. 2B is a graph showing a curve 220 representing the output voltage from the capacitor 122 during the measurement process. The output voltage from the capacitor 122 is shown at the first time when the output voltage is increased to the first threshold voltage of 430 V. At this time the capacitor 122 is fully charged and the output voltage is constant. When the power monitor controller 130 shuts off the power correction factor circuit 120, the voltage input to the capacitor 122 drops to zero. The capacitor 122 then begins to discharge causing the voltage output to decrease as shown in a segment 222 of the curve 220. When the voltage output decreases to the second threshold voltage of 330 V, the power monitor controller 130 determines the second time from the power monitor 130. The power monitor controller 130 then turns on the power correction factor circuit 120 and causes the capacitor 122 to charge to the normal output voltage of 380 V as shown in a segment 224 of the curve 220 in FIG. 2B.

The power monitor controller 130 determines the capacitance C of the capacitor 122 based on the below equation:

$$C=[2 \times P \times (T2-T1)]/(VH^2-VL^2)$$

In the above equation, P is the power dissipated by the PSU 100 and the load system 110 during the time period between the first and second times as determined by the controller 128 based on the count data and power measurement data from the power monitor 130, T1 is the first time where the first voltage threshold is output from the capacitor 122, T2 is the second time where the second voltage threshold is output from the capacitor 122, VH is the first voltage threshold, and VL is the second voltage threshold. In this example, the T1 value is 0 and the T2 value is 20 ms. The measured power dissipation between the difference of T1 and T2 is 100 W. The first threshold voltage V1 is 430 V and the second threshold voltage V2 is 330 V. This results in a capacitance of 52.6 µF as determined through the above equation.

The above described discharging of the capacitor 122 to measure capacitance is preferable because it is more accurate and occurs during normal operation of the power supply unit 100. However, the power monitor controller 130 may also determine the capacitance of the capacitor 122 by charging the capacitor 122. In this process, the power monitor controller 130 operates to determine the capacitance of the capacitor 122 while the PSU 100 is operating to supply power to the load system 110. The power monitor controller 130 may initiate the measurement of the capacitance of the capacitor 122 in response to an external command via the bus 114 or one of the other methods explained above.

The power monitor controller 130 controls the power factor correction circuit 120 to regulate the voltage output to the capacitor 122 to a specific first threshold voltage. For example, the input voltage to the capacitor 122 may be lowered from the normal voltage of 380 V to a first threshold voltage of 320 V. In this example, the time that the voltage from the capacitor 122 reaches the first threshold voltage output of 320 V is determined and stored in memory.

The power monitor controller 130 then controls the power factor correction circuit 120 to increase voltage output to the capacitor 122, thereby allowing the capacitor 122 to charge. The charging of the capacitor 122 increases the output voltage of the capacitor 122 to a second threshold voltage. The second threshold voltage in this example is a voltage level below the maximum capacity of the capacitor 122 such as 400 V. The power monitor controller 130 monitors the voltage output of the capacitor 122 via the power monitor 130. When the voltage output reaches a second threshold voltage, the power monitor controller 130 determines the time the voltage output reaches the second threshold voltage based on the counting data from the power monitor 130. The second time is also stored by the power monitor controller 130.

The power monitor controller 130 may then control the power factor correction circuit 120 to allow power flow from the PSU 100 at the normal voltage level by increasing the input voltage to the capacitor 122 to produce the desired output from the DC to DC converter 124. The power monitor controller 130 may determine the capacitance by determining the time period between the first and second times, the power dissipated during the time period and the deviation between the corresponding threshold voltages. The power monitor controller 130 may transmit the determined capacitance via the bus 114 to the monitoring system 112.

Figure 3A:
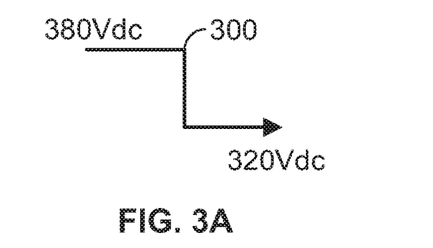
FIGS. 3A and 3B are graphs showing the voltage output from the power supply unit in FIG. 1 and the voltage output at the capacitor in the power supply unit in FIG. 1 during measurement of capacitance by charging the capacitor.

FIG. 3A is a graph showing a line 300 representing the output voltage from the power correction factor circuit 120 to the capacitor 122 during the measurement process using capacitor charging as described above. As may be seen in FIG. 3A, the output voltage begins at 380 V, which is the normal output of the power supply unit 100 in this example. The controller 128 decreases the output voltage of the power factor correction circuit 122 to the first threshold voltage of 320 V as shown in FIG. 3A.

Figure 3B:
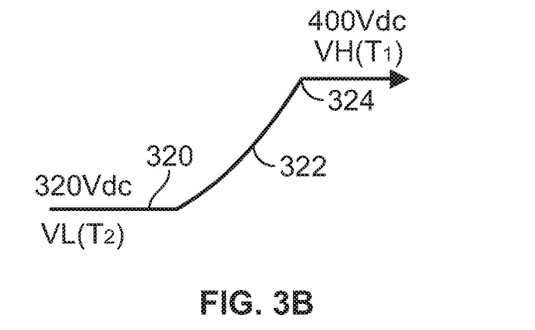

FIG. 3B is a graph showing a line 320 representing the output voltage from the capacitor 122. The output voltage from the capacitor 122 is shown at the first time when the output voltage is decreased to the first threshold voltage of 320 V. At this time the capacitor 122 begins charging from the increase in voltage output of the power correction factor circuit 120 as shown in a segment 322 of the line 320. When the voltage output increases to the second threshold voltage of 400 V at a point 324 as shown in FIG. 3B, the power monitor controller 130 determines the second time. The power monitor controller 130 then controls the power correction factor circuit 120 and causes the capacitor 122 to maintain a normal output voltage of 400 V as shown in FIG. 3B.

The power monitor controller 130 determines the capacitance C of the capacitor 122 based on the below equation:

$$C=[2\times P\times(T1-T2)]/(VH^2-VL^2)$$

In the equation, P is the power dissipated by the PSU 100 and the load system 110 during the time period between the first and second times as determined by the controller 128, T2 is the first time where the first voltage threshold is output, T1 is the second time where the second voltage threshold is output, VL is the first threshold voltage, and VH is the second threshold voltage. In this example, the T1 value is 20 ms, the T2 value is 0, the first threshold voltage VL is 320 V and the second threshold voltage VH is 400 V. The total power dissipated in the time period between T1 and T2 is 200 W and thus a capacitance of 138.8 µF is determined from the above equation.

The methods described above allow the determination of capacitance in order to assist in detecting system failure without the need to shut down the power supply unit. The capacitance data allows the operator to control and manage the capacitance in a power supply. If the capacitance exceeds the rating of the capacitor, the data may be used for failure reporting and analysis.

Figure 4:
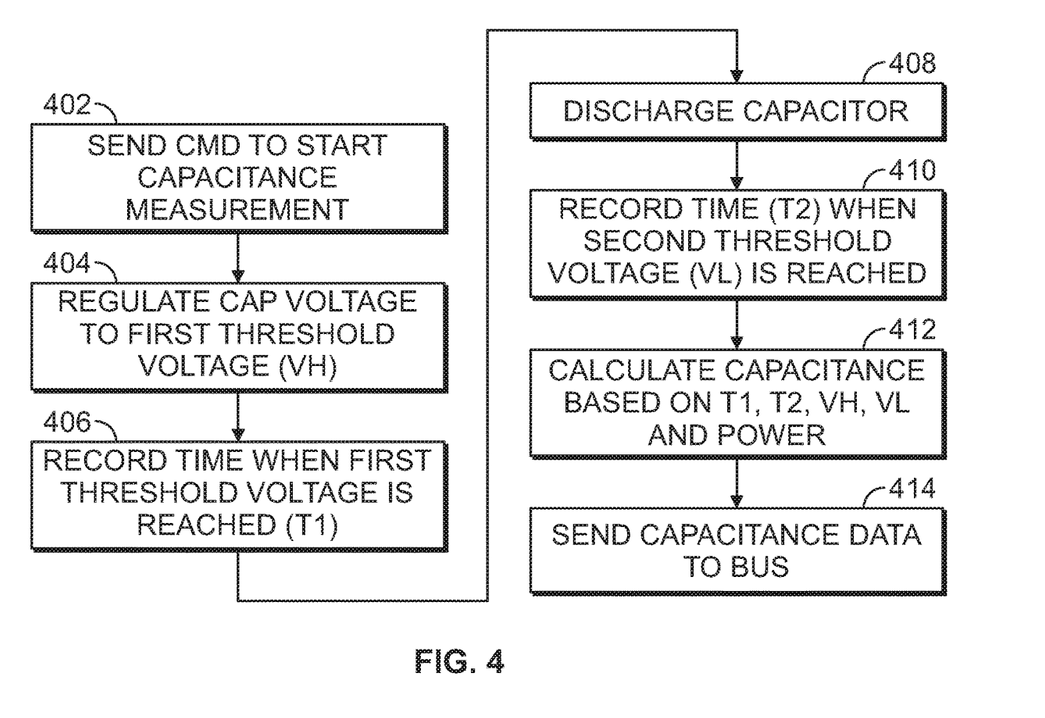
FIG. 4 is a flow diagram of the process of determining the capacitance of the power supply unit shown in FIG. 1 when the capacitor is discharging.

FIG. 4 shows a flow diagram of the algorithm executed by the power monitor controller 130 to determine the capacitance of the power supply unit 100 in FIG. 1 based on discharging the capacitor 122. The flow diagram in FIG. 4 is representative of example machine readable instructions for the power monitor controller 130 in FIG. 1. In this example, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the interfaces could be implemented by software, hardware, and/or firmware. Also, some or all of the machine readable instructions represented by the flowchart of FIG. 4 may be implemented manually. Further, although the example algorithm is described with reference to the flowcharts illustrated in FIG. 4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The power monitor controller 130 first initiates a command to the power factor correction circuit 120 to start the capacitance measurement process (402). The controller 128 then controls the power factor correction circuit 120 to regulate the voltage of the capacitor to the first threshold voltage (404). The power monitor controller 130 then records the first time when the first threshold voltage is reached and the power correction factor circuit 120 then turns off the output to the capacitor 122 (406).

The capacitor 122 then discharges and the power monitor controller 130 monitors the output voltage of the capacitor 122 (408). When the output voltage of the capacitor 122 reaches the second threshold voltage, the power monitor controller 130 determines the second time from the power monitor 130 (410). The power monitor controller 130 determines the power dissipated in the time period between the first and second times. The power monitor controller 130 then determines the capacitance of the capacitor 122 based on the power, the first and second times and the first and second threshold voltages based on the above equation (412). The power monitor controller 130 then sends the determined capacitance value on the PMBus 114 to the monitoring system 112 (414).

Figure 5:
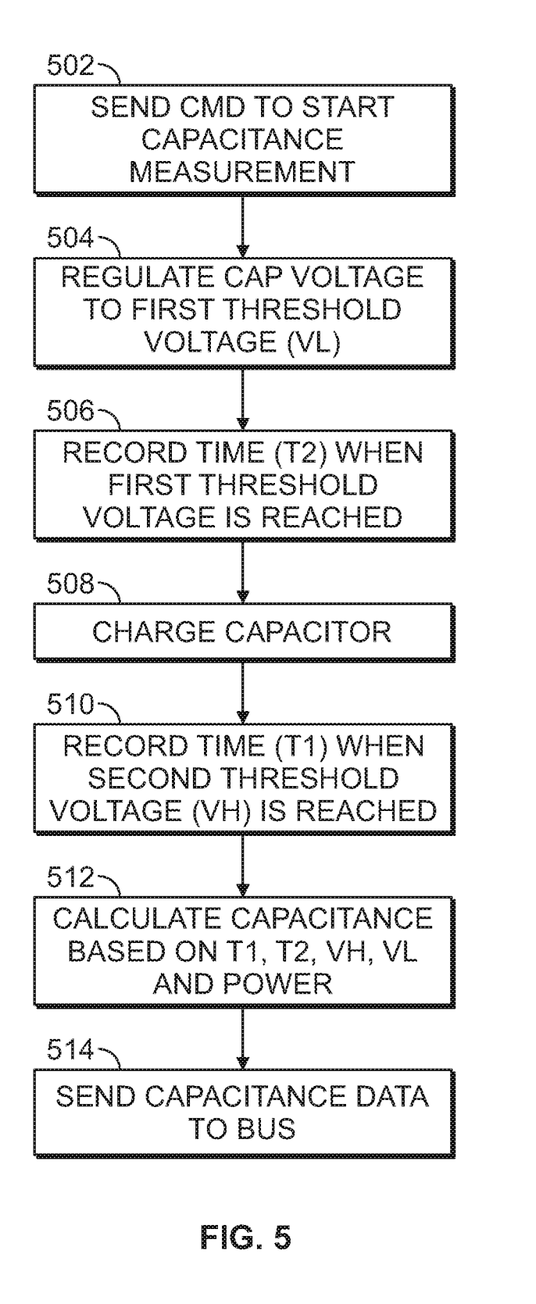
FIG. 5 is a flow diagram of the process of determining the capacitance of the power supply unit shown in FIG. 1 when the capacitor is charging.

FIG. 5 is a flow diagram of another algorithm executed by the power monitor controller 130 to determine capacitance based on charging the capacitor 122 in FIG. 1. The power monitor controller 130 first initiates a command to the power factor correction circuit 120 to start the capacitance measurement process (502). The power monitor controller 130 then controls the power factor correction circuit 120 to regulate the voltage of the capacitor to the first threshold voltage (504). The power monitor controller 130 then records the first time when the first threshold voltage is reached and then turns on the power correction factor circuit 120 (506).

The capacitor 122 then charges and the power monitor controller 130 monitors the output voltage of the capacitor 122 via the power monitor 130 (508). When the output voltage reaches the second threshold voltage, the power monitor controller 130 determines the second time (510). The power monitor controller 130 determines the power dissipated in the time period between the first and second times. The power monitor controller 130 then determines the capacitance of the capacitor 122 based on the power, the first and second times and the first and second threshold voltages based on the above equation (512). The power monitor controller 130 then sends the determined capacitance value on the PMBus 114 to the monitoring system 112 (514).

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system to detect a capacitance of a capacitor in a power supply unit, the system comprising:
    a capacitor storing charge from a voltage source;
    a power correction circuit to set the voltage output from the capacitor at a first threshold voltage and change the voltage output from the capacitor to a second threshold voltage via the voltage source; and
    a controller operable to:
        determine a first time when the voltage output from the capacitor is at the first threshold voltage,
        determine a second time when the voltage output from the capacitor is at the second threshold voltage;
        determine power dissipation from the power supply unit between the first and second times; and
        determine the capacitance based on the first and second threshold voltages, the first and second times, and the determined power dissipation during operation of the power supply unit;
    wherein, when the first threshold voltage is greater than the second threshold voltage, the capacitance is determined based on:

$$C=[2\times P\times(T2-T1)]/(VH^2-VL^2)$$

wherein C is the capacitance, T1 is the first time, T2 is the second time, P is the dissipated power, VH is the first threshold voltage, and VL is the second threshold voltage; and
    wherein, when the first threshold voltage is less than the second threshold voltage, the capacitance is determined based on:

$$C=[2\times P\times(T1-T2)]/(VH^2-VL^2)$$

wherein C is the capacitance, T2 is the first time, T1 is the second time, P is the dissipated power, VL is the first threshold voltage, and VH is the second threshold voltage.

2. The system of claim 1, wherein the power correction circuit changes the voltage from a higher voltage at the first time to a lower voltage at the second time, wherein the controller determines capacitance during a discharge period of the capacitor.

3. The system of claim 1, wherein the power correction circuit changes the voltage from a lower voltage at the first time to a higher voltage at the second time, wherein the controller determines capacitance during a charging period the capacitor.

4. The system of claim 1, wherein the controller is a baseboard master controller, a microprocessor control unit or a digital signal processor.

5. The system of claim 1, further comprising a bus coupled to the controller, wherein the capacitance is reported via the bus to another device.

6. The system of claim 5, wherein the bus is a Power Management bus.

7. The system of claim 1, further comprising a power monitor coupled to a voltage input of the voltage output and a voltage output from a DC converter coupled to the capacitor, the power monitor outputting the first and second times, and the power from the voltage output from the DC converter.

8. A method to detect capacitance of a capacitor in a power supply unit, during operation of the power supply unit, the method comprising:
    setting an output voltage of the capacitor to a first threshold voltage at a first time;
    changing the output voltage of the capacitor to a second threshold voltage;
    determining when the capacitor outputs the second threshold voltage;
    determining a second time when the capacitor outputs the second threshold voltage;
    determining the power dissipated by the power supply unit between the first and second times; and
    determining the capacitance of the capacitor based on the first and second threshold voltages, the first and second times, and the power dissipation;

wherein, when the first threshold voltage is greater than the second threshold voltage, determining the capacitance is based on:

$$C=[2 \times P \times (T2-T1)]/(VH^2-VL^2)$$

wherein C is the capacitance, T1 is the first time, T2 is the second time, P is the dissipated power, VH is the first threshold voltage, and VL is the second threshold voltage; and wherein, when the first threshold voltage is less than the second threshold voltage, determining the capacitance is based on:

$$C =[2 \times P \times (T1-T2)]/(VH^2-VL^2)$$

wherein C is the capacitance, T2 is the first time, T1 is the second time, P is the dissipated power, VL is the first threshold voltage, and VH is the second threshold voltage.

9. The method of claim 8, wherein the output voltage of the capacitor is changed from a higher voltage at the first time to a lower voltage at the second time, wherein the capacitance is determined during a discharge period of the capacitor.

10. The method of claim 8, wherein the output voltage of the capacitor is changed from a lower voltage at the first time to a higher voltage at the second time, wherein the capacitance is determined during a charging period of the capacitor.

11. The method of claim 8, wherein a controller determines the capacitance.

12. The method of claim 8, further comprising reporting the determined capacitance to another device.

13. The method of claim 12, wherein the reporting is performed via a data bus.

14. A power supply unit operable to determine capacitance during operation, the power supply unit comprising:
   a power input;
   a power correction factor circuit coupled to the power input to output a voltage;
   a capacitor coupled to the power correction factor circuit, wherein the power correction circuit sets the voltage output from the capacitor at a first threshold voltage and changes the voltage output from the capacitor to a second threshold voltage;
   a DC to DC converter coupled to the capacitor, the DC to DC converter including a power output; and
   a controller operable to:
      determine a first time when the voltage output from the capacitor is at the first threshold voltage,
      determine a second time when the voltage output from the capacitor is at the second threshold voltage;
      determine power dissipation from the power supply unit between the first and second times; and
      determine the capacitance based on the first and second threshold voltages, the first and second times, and the determined power dissipation during operation of the power supply unit;
   wherein, when the first threshold voltage is greater than the second threshold voltage, the capacitance is determined based on:

$$C=[2 \times P \times (T2-T1)]/(VH^2-VL^2)$$

wherein C is the capacitance, T1 is the first time, T2 is the second time, P is the dissipated power, VH is the first threshold voltage, and VL is the second threshold voltage; and wherein, when the first threshold voltage is less than the second threshold voltage, the capacitance is determined based on:

$$C =[2 \times P \times (T1-T2)]/(VH^2-VL^2)$$

wherein C is the capacitance, T2 is the first time, T1 is the second time, P is the dissipated power, VL is the first threshold voltage, and VH is the second threshold voltage.

* * * * *